(12) United States Patent
Ranjan et al.

(10) Patent No.: US 10,971,373 B2
(45) Date of Patent: Apr. 6, 2021

(54) METHODS FOR CYCLIC ETCHING OF A PATTERNED LAYER

(71) Applicant: Tokyo Electron Limited, Tokyo (JP)

(72) Inventors: Alok Ranjan, Tomiya (JP); Vinayak Rastogi, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/446,070

(22) Filed: Jun. 19, 2019

(65) Prior Publication Data

US 2019/0304798 A1 Oct. 3, 2019

Related U.S. Application Data (62) Division of application No. 15/439,670, filed on Feb. 22, 2017, now Pat. No. 10,366,902.

(Continued)

(51) Int. Cl.
*H01L 21/311* (2006.01)
*H01L 21/02* (2006.01)
(Continued)

(52) U.S. Cl.
CPC .. *H01L 21/31138* (2013.01); *H01L 21/02252* (2013.01); *H01L 21/3081* (2013.01);
(Continued)

(58) Field of Classification Search
None
See application file for complete search history.

(56) References Cited

U.S. PATENT DOCUMENTS

| 2005/0048789 A1* | 3/2005 | Merry | H01L 21/0332 |
| | | | 438/723 |
| 2012/0040522 A1* | 2/2012 | Cheng | H01L 21/823462 |
| | | | 438/585 |

(Continued)

FOREIGN PATENT DOCUMENTS

| KR | 10-2005-0112125 A | 11/2005 |
| KR | 10-2007-0089058 A | 8/2007 |

(Continued)

OTHER PUBLICATIONS

Combined Office Action and Search Report dated Apr. 25, 2018 in Taiwanese Patent Application No. 106105839 (with English language translation), 10 pages.

(Continued)

*Primary Examiner* — Jay C Chang
(74) *Attorney, Agent, or Firm* — Oblon, McClelland, Maier & Neustadt, L.L.P.

(57) ABSTRACT

Methods and systems for cyclic etching of a patterned layer are described. In an embodiment, a method includes receiving a substrate comprising an underlying layer, a mask layer that exposes portions of an intermediate layer that is disposed between the underlying layer and the mask layer. An embodiment may also include forming a first layer on the mask layer and a second layer on the exposed portions of the intermediate layer, the first layer and the second layer being concurrently formed. Additionally, the method may include removing, concurrently, the first layer and the second layer from the substrate. In such embodiments, the method may include alternating between the forming and the removing until portions of the underlying layer are exposed.

7 Claims, 10 Drawing Sheets

Related U.S. Application Data (60) Provisional application No. 62/298,195, filed on Feb. 22, 2016.

(51) Int. Cl.
  *H01L 21/3065* (2006.01)
  *H01L 21/308* (2006.01)

(52) U.S. Cl.
  CPC .. *H01L 21/30655* (2013.01); *H01L 21/31116* (2013.01); *H01L 21/31144* (2013.01); *H01J 2237/334* (2013.01)

(56) References Cited

U.S. PATENT DOCUMENTS

| | | | |
|---|---|---|---|
| 2014/0120726 A1* | 5/2014 | Nemani | H01L 21/3105 438/694 |
| 2014/0144876 A1 | 5/2014 | Nakagawa | |
| 2014/0213060 A1* | 7/2014 | Kao | H01L 21/31144 438/703 |
| 2016/0013067 A1 | 1/2016 | Wang | |
| 2016/0097131 A1* | 4/2016 | Agarwal | C23F 1/12 216/13 |

FOREIGN PATENT DOCUMENTS

| | | |
|---|---|---|
| KR | 10-2010-0035159 A | 4/2010 |
| KR | 10/2014/0051282 | 4/2014 |
| KR | 10-2016-0007441 | 1/2016 |

OTHER PUBLICATIONS

Office Action dated Feb. 21, 2019 in Korean Patent Application No. 10-2017-0023530 (with English Translation) citing references AO-AP therein, 17 pages.

Silicon on Insulator—Soi Wafers i Silicon Valley Microelectronics, Jul. 11, 2018 https://www.svmi.com/silicon-wafers/silicon-insulator-wafers/.

Combined Taiwanese Office Action and Search Report dated Oct. 28, 2020 in Patent Application No. 1 081 3461 8 (with English translation), 9 pages.

\* cited by examiner

METHODS FOR CYCLIC ETCHING OF A PATTERNED LAYER

CROSS-REFERENCE TO RELATED APPLICATIONS

This application is a divisional application of U.S. application Ser. No. 15/439,670, filed Feb. 22, 2017 which is related to and claims priority to U.S. provisional application Ser. No. 62/298,195 filed on Feb. 22, 2016, the entire contents of which are herein incorporated by reference.

FIELD OF THE DISCLOSURE

This invention relates to semiconductor processing technology, and more particularly, to apparatus and methods for cyclic etching of a patterned layer.

BACKGROUND

The geometries of microelectronic features continue to scale to smaller sizes and increase in complexity. Accordingly, the patterning techniques used to manufacture microelectronic devices may need to become more precise to create smaller features and minimize damage to the films during manufacturing. Previously, selective etching or high precision etching has been attempted by alternating between precursor deposition (passivation) and etching using plasma processing. However, these conventional approaches have been plagued by aspect ratio, profile variation, and cycle time issues. Accordingly, new high precision etching techniques that may overcome the aforementioned issues may be desirable.

SUMMARY

Methods and systems for cyclic etching of a patterned layer are described. In an embodiment, a method includes receiving a substrate comprising an underlying layer, a mask layer that exposes portions of an intermediate layer that is disposed between the underlying layer and the mask layer. An embodiment may also include forming a first layer on the mask layer and a second layer on the exposed portions of the intermediate layer, the first layer and the second layer being concurrently formed. Additionally, the method may include removing, concurrently, the first layer and the second layer from the substrate. In such embodiments, the method may include alternating between the forming and the removing until portions of the underlying layer are exposed.

Another embodiment of a method may include receiving a substrate comprising an underlying layer, a mask layer that exposes portions of an intermediate layer that is disposed between the underlying layer and the mask layer. Additionally, the method may include exposing the substrate to a passivation plasma. Further, the method may include transitioning the passivation plasma to a desorption plasma. Additionally, the method may include alternating between the passivation plasma and the desorption plasma.

In another embodiment, a method may include receiving a substrate comprising an underlying layer, a mask layer that exposes portions of an intermediate layer that is disposed between the underlying layer and the mask layer. Such a method may also include applying a sacrificial layer on the mask layer and the intermediate layer. The method may additionally include removing the sacrificial layer and portions of the mask layer and the intermediate layer, the portion of the intermediate layer being of a greater volume than the portion of the mask layer that is removed from the substrate. Additionally, the method may include alternating between the applying and the removing until a desired amount of the intermediate layer is removed.

Embodiments of systems are also described, which include controller or processor components configured to execute operational instructions comprising computer readable code defining application or process code stored in a computer readable medium, such as a data storage disk, memory device, or the like. The operations carried out by such a controller may be defined, according to the methods described above. One of ordinary skill will recognize that certain aspects may be carried out by hardware components, such as Field Programmable Gate Arrays (FPGAs), Programmable Logic Chips (PLCs), Application Specific Integrated Circuits (ASICs), or the like.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

"Substrate" or "Microelectronic substrate" as used herein generically refers to the object being processed in accordance with the embodiments described herein. The microelectronic substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

The described embodiments relate to plasma processing methods for cyclic etching of substrates used to manufacture microelectronic devices. Cyclic precision etching may include the systematic removal of film layers over a period time, until a targeted film thickness is achieved or the film is removed to expose the underlying film or substrate. The cyclic etching may be enabled by exposing the substrate to plasma that may be transitioned between a passivation/activation state and a desorption state. For example, the passivation/activation plasma may be used to pre-treat or prepare portions of the substrate that may be removed by the desorption plasma.

In one embodiment, the substrate may include an underlying layer, a mask layer that exposes portions of an intermediate layer that is disposed between the underlying layer and the mask layer. For example, the underlying layer may be a hard-mask layer that may be covered by an anti-reflective coating (ARC) layer (e.g., intermediate layer). The intermediate layer may be partially covered by a patterned mask layer that exposes portion of the intermediate layer that may be exposed to plasma during the cyclic etching process. Broadly, the plasma treatment may include, but is not limited to, a passivation/activation step that uses a passivation/activation plasma that applies a passivation layer to the mask layer and a activation layer to the exposed intermediate layer. The passivation/activation step may be followed by a desorption step that removes the passivation layer and the activation layer using the desorption plasma. In one approach, the passivation layer and the activated layer may be concurrently removed. Subsequently, the process may cycle through or alternate between the passivation plasma and the desorption plasma until a desired amount of the intermediate layer is removed or the underlying layer is exposed.

The passivation and activation layers may be formed concurrently using similar plasma process conditions. The passivation and activation layers are not required to be identical in chemical composition, however they may be the same or similar with respect to etch rate when exposed to the desorption plasma. Such that, the critical dimension of the opening or pattern of the mask layer is maintained after being exposed to the desorption plasma. In this instance, the etch selectivity between passivated and activated layers may be relativity high compared to the mask layer and the intermediate layer. In this way, the critical dimension may be maintained by removing the passivated layer from the mask layer without removing portions of the mask layer or only very small amounts of the mask layer compared to the passivated layer. However, the activated layer may have lower etch selectivity, such that the desorption plasma may remove the activated layer and a portion of the intermediate layer that was underneath the activated layer.

In one embodiment, the mask layer comprises a light-sensitive film and the intermediate layer comprises any combination of the following: silicon, oxygen, hydrogen, carbon, nitrogen, or any combination thereof. For example, the mask layer may include any organic film or photoresist layer that may include, but is not limited to, ArF photoresist or EUV photoresist. The passivation layer formed on the mask layer may include a polymer (e.g., $C_xF_y$) that may be formed by the passivation plasma that may include a fluorocarbon ($C_xF_y$) gas mixture or a fluorocarbon ($C_xF_y$) and hydrocarbon ($C_xH_y$) gas mixture.

The intermediate layer may include, but is not limited to, SiARC, BARC, SiON, LTO, or $SiO_2$ that may be used to pattern the underlying layer in subsequent processing. The intermediate layer may comprise any combination of the following: silicon, oxygen, hydrogen, carbon, nitrogen, or any combination thereof. The activation layer formed on the intermediate layer may include, but is not limited to, an activated inorganic fluorocarbon polymer complex (CFx) ((e.g., CF, CF2, etc.).

In one embodiment, the passivation/activation layers may have a lower etch selectivity with respect to the desorption plasma relative to the mask layer and the intermediate layer. In view of the etch selectivity, the desorption plasma may be enabled to remove or etch of passivation/activation layers while minimizing the removal of and/or damage to the underlying substrate. In one embodiment, the etch selectivity between the passivation/activation layers and the mask and intermediate layers may be high enough that the removal process may be self-limiting, in one embodiment. In this way, the plasma treatment may aggressively or systematically remove the passivation/activation layers without removing the mask layer, in that the plasma treatment appears not to etch the mask layer despite being exposed to the desorption plasma that removes the passivation/activation layers. Cyclic etching of the substrate may be implemented by transitioning between passivation/activation plasma and desorption plasma may be implemented using variety of plasma processing techniques.

In one embodiment, the passivation/activation layers plasma (e.g., first plasma) may be generated by applying a first energy source (e.g., microwave) to a process gas mixture in a plasma process chamber. The gas mixture may include a reactant gas (e.g., $C_xF_y$ containing gas, and/or $C_xH_x$-containing gas) and a dilution gas (e.g., Ar, He, combinations thereof, etc.) that may be relatively inert to the substrate, when compared to the reactant gas, under the passivation/activation plasma conditions. More particularly, the reactant gas mixture may include, but is not limited to, CF4, C4F6, C4F8, C5F6, C5F7, CH3F, CHF3, C5F7, or any combination thereof.

The process conditions for the cyclic etching method may include, but are not limited to, chamber pressure, power, gas mixture composition and concentration. In this instance, during passivation/activation, the chamber pressure may be greater than 2 mTorr and be up to 800 mTorr and the first energy source may apply a power between 0 W and 450 W at a frequency of about 2.45 GHz or within a range of 300 MHz to 10 GHz to a source electrode disposed in the plasma processing chamber. In other embodiments, power may be between 450 W and 550 W or at about 500 W. The process gas mixture may include a reactant gas that may between 2% and 80% by volume during the passivation/activation process wherein the passivation/activation plasma comprises a concentration by volume of $C_xF_y$ between 2% by volume and 50% by volume, $C_xH_y$ between 2% by volume and 50% by volume, or combination thereof between 2% by volume and 80% by volume. The ions and radicals generated in the passivation/activation plasma may be used to treat the surface of the substrate for a time up to 5000 ms, or more particularly between 100 ms and 500 ms.

During the passivation/activation plasma treatment, the chemical composition of the substrate surface may be passivated or activated depending on the type of reactant gas and the type of substrate material that is exposed to the passivation/activation plasma. In practice, the passivation/activation layers on the surface of the substrate has different chemical and physical properties that may distinguishable from the underlying substrate. These differences may include, but are not limited to, differences in etch rate under certain plasma conditions, such that the passivation/activation layers are more likely to be removed at a higher rate than the underlying material when exposed to the same plasma. Hence, transitioning from an passivation/activation plasma to a desorption plasma may enable a highly selective etch process that may be repeated until a desired amount of the substrate has been removed.

The passivation/activation plasma may be transitioned to a desorption plasma by altering, at least one of the following, the gas mixture, pressure, power, or a combination thereof. One or more gas purges may be implemented between the passivation/activation plasma and the desorption plasma, but are not required.

In one embodiment, the transition to from the passivation/activation plasma to the desorption plasma may occur by varying the gas mixture and the power to generate ions that may selectively remove portions of the substrate treated or formed by the passivation/activation plasma. The transition may occur by changing the process conditions in part, or in whole, to enable the transition between the passivation/activation plasma to the desorption plasma. The process conditions may include, but are not limited to, gas mixture/type, pressure, power, or any combination thereof. In one embodiment, the transition may occur by exchanging the types of gases. For example, the passivation/activation plasma may use a fluorocarbon based chemistry and the desorption plasma may use a less chemically reactive or inert (relative to the substrate) chemistry to generate ions that may be used to remove the passivation/activation layers. In one embodiment, the desorption plasma comprises concentration by volume of the inert gases between 5% and 100% and the desorption plasma comprises one or more of the following gases: Ar, He, Xe, Ne, Kr or any combination thereof. Although the gas mixtures may be completely different, it is not required that each gas mixture be completely purged from the process chamber. In fact, portions of the fluorocarbon chemistry may still be present during the desorption plasma step, however at a much lower concentration than during the passivation/activation step. For example, the desorption plasma comprises a higher concentration by volume of inert gases relative to passivation plasma, the inert gases being less chemically reactive with the substrate than CxFy, such that the desorption plasma comprises CxFy or CxHy, diluted with Ar, He, Xe, Ne, Kr to a much higher degree than the inert gas dilution during the passivation plasma step. The desorption plasma pressure may be less than the passivation plasma pressure. The desorption plasma pressure may range between 5 mTorr and 500 mTorr.

Figure 1:
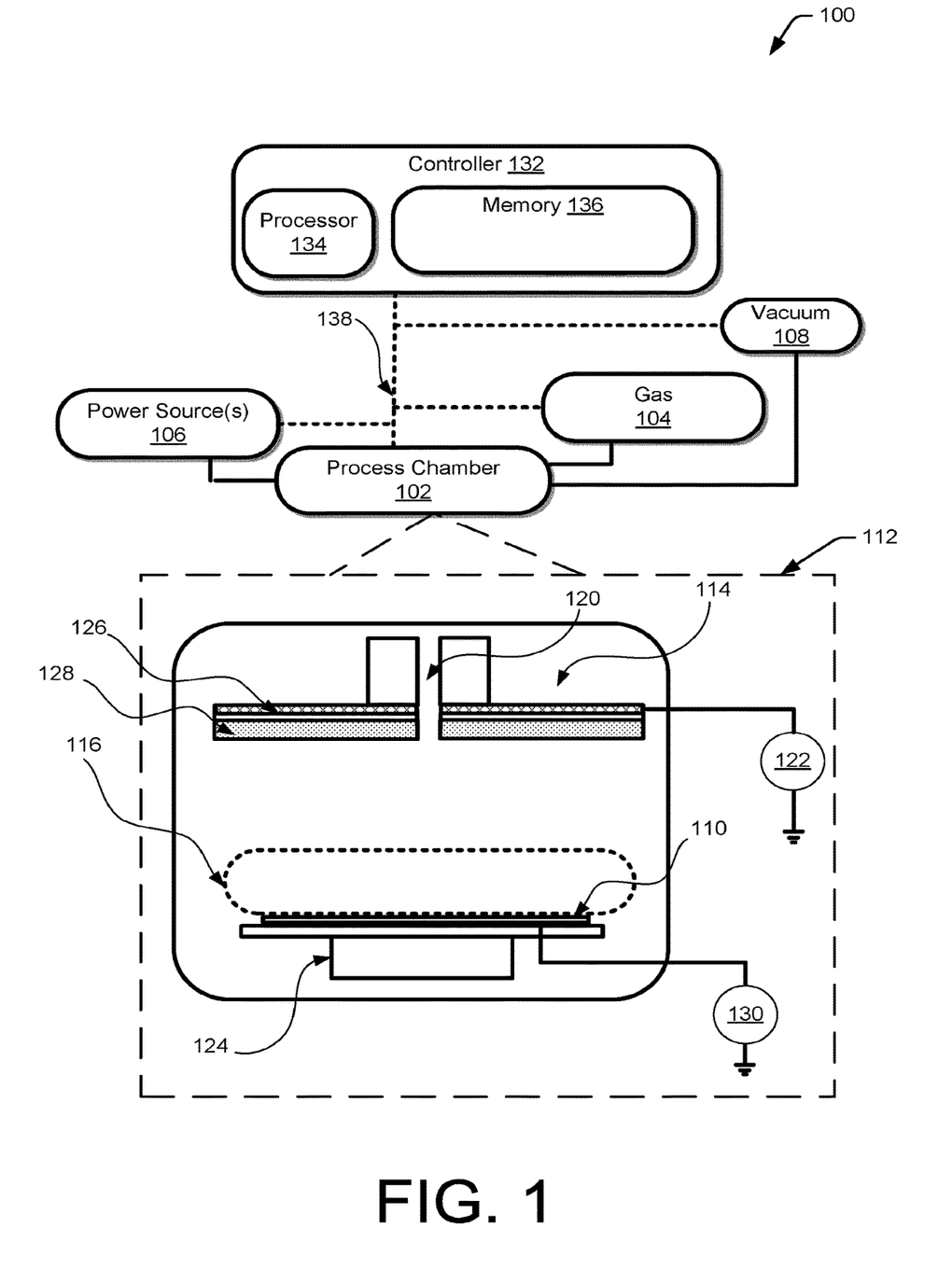
FIG. 1 is an illustration of one embodiment of a plasma processing system that shows a schematic cross-sectional illustration of a plasma chamber that may enable the transition between a first plasma and a second plasma to treat a substrate according to at least one embodiment.

FIG. 1 depicts a plasma processing system 100 for treating substrates using plasma (not shown) that may be generated in a plasma chamber 102. Plasma may be generated by applying electromagnetic energy (e.g., power sources 106) to a process gas mixture that is provided by a gas delivery system 104 to the plasma chamber 102. The gas delivery system 104 may include mass flow controllers, check valves, and the like to be used control gas mixture distribution. A vacuum system 108 in fluid communication with the plasma chamber 102 may also maintain a sub-atmospheric pressure during plasma generation. The vacuum system 108 may include one or more pumps and control systems (e.g., $N_2$ ballast system, butter-fly valve system) to control the pressure within the plasma chamber 102.

Plasma generation may be done by applying electromagnetic energy to an electrically neutral gas to cause electrons to be released from a gas molecules that are positively charged (e.g., ion) as result of the lost electron. The ions may be characterized as a molecule or atom where the total number of electrons are not equal to the total number of protons resulting in a positive charge. Molecular or atomic radicals (e.g., molecules or atoms with at least one unpaired electron) may also be generated from the electrically neutral gas. Generally, the radicals may have a neutral, positive, or negative charge and may have high chemical reactivity relative to the ions. Over time, the electromagnetic energy and the increasing electron collisions within the gas mixture may increase the density of ionized molecules and radicals within the gas mixture that may be used to treat the substrate 110.

The plasma chamber system 100 may alter certain process conditions to influence the amount of flow of ions and/or radicals towards the substrate, such that the ionized molecules may be influenced by potential differences within the plasma chamber 102. For example, the potential differences within the plasma chamber 102 may direct the ionized molecules (or atoms, or radicals) towards a substrate 110. The ions and radicals may interact with the substrate or treat the substrate through deposition or passivation that alters the surface of the substrate or that may remove a portion of the substrate following the deposition or passivation.

In FIG. 1, the plasma chamber 102 cross section illustration 112 illustrates one embodiment of a power source assembly 114 that enables the transmission of electromagnetic energy (e.g., microwave energy, RF energy) and the gas mixture (not shown) into the region proximate to the substrate 110. The gas mixture may be introduced into the plasma processing region 116 that is proximate to the substrate holder 124, along the gas pathway 120 through the center of the power source assembly 114. In other embodiments, the gas mixture may be introduced from other locations within the plasma chamber 102. The plasma processing region 116 may also receive energy from a first energy source 122 to generate plasma that may be used to treat a substrate 110 disposed on the substrate holder 124. The electromagnetic energy may include electromagnetic energy (e.g., microwave energy @>300 MHz and/or radiofrequency (RF) energy @<300 MHz) that may transmitted, in some way, from the power source 106 to the power source assembly 114. In the FIG. 1 embodiment, the power source assembly 114 may include a microwave waveguide 126 and the dielectric component 128 may be disposed around the gas pathway 118. In other embodiments, the power source assembly 114 may include an antenna plate (not shown) that may be arranged in a way that enables current to flow around the power assembly 114 in a plane that may substantially parallel to the substrate 110. The current may be induced to flow between a RF power source (not shown) and the ground terminal (not shown) along a low impedance path (e.g., metal layer) and generate a magnetic field (not shown) around the low impedance path that may be used to generate plasma in the plasma processing region 116 or generate plasma in a region above 116 and transmit plasma to the plasma processing region 116.

The gas mixture in the plasma processing region 116 may also receive electromagnetic energy from a second source (e.g., bias power source 130) that may bias the substrate holder 124 and influence the plasma characteristics proximate to the substrate 110. In some embodiments, as will be described in greater detail in the description below, the bias power source 130 and the first power source 122 may be operated in unison or alone to generate plasma within the plasma processing region 116. In one embodiment, the bias power source 130 may be an RF power source that may provide more than 50 W of power at 10 MHz or higher. The biasing of the substrate holder 124 and the power assembly 114 may be implemented by using a controller 132 that may coordinate the process sequencing that enables plasma generation within the plasma processing region 116.

The controller 132 may use a computer processor 134 and memory 136 to execute computer-readable instructions that may be provided over an electrical communication network 138 to control the plasma processing system 100 components (e.g., power sources 106, gas delivery 104, etc.). The one or more computer processors 134 may include, without limitation: a central processing unit (CPU), a digital signal processor (DSP), a reduced instruction set computer (RISC), a complex instruction set computer (CISC), a microprocessor, a microcontroller, a field programmable gate array (FPGA), or any combination thereof. The memory 136 may include one or more computer-readable storage media ("CRSM"). In some embodiments, the one or more memories may include non-transitory media such as random access memory ("RAM"), flash RAM, solid state media, and so forth. Broadly, the controller 132 may control the sequencing of processing events that enable plasma generation or to transition between different types of plasma that may be exposed to the substrate 110.

The plasma processing system 100 may be used to implement several different types of plasma that may be used to etch patterns into or remove portions of the substrate 110 to manufacture electronic devices. As the size and complexity of electronic devices increases, the need for highly selective etch processes that do not damage structures on the substrate 110 has increased. One approach to higher selectivity may include self-limiting layer etch processes that may alternate between precursor deposition steps (e.g., deposition, oxidation, passivation, etc.) and the removal of the precursor layer. In one specific embodiment, the initial surface treatment may be a passivation/activation process in which an atoms or molecules permeate or diffuse into the surface of the substrate 110. The passivation/activation process may alter one or more monolayers of the surface of the substrate 110, such that the monolayer(s) are more easily removed or etched away from the substrate 110 during a subsequent process. One exemplary subsequent process, may include a desorption process that may be used to remove monolayer(s) without damaging the underlying substrate 110. The combination or the transition between passivation/activation and desorption may enable the removal of the monolayer(s) of the substrate 110 in a controlled or highly selective manner. The plasma processing system 100 may implement one or more methods to alternate between passivation/activation and desorption processes within the plasma chamber 102.

FIGS. 2-6 illustrate multiple processing embodiments for transitioning between passivation/activation plasma and desorption plasma that may be used to remove monolayers from portions of the substrate 110. These embodiments are intended to describe the relationship between the process conditions that may be implemented by the plasma processing system 100 and not intended to be limited to a specific chemistry scheme or process conditions disclosed herein. The scope of the process condition relationships are not intended to be limited to the illustrated embodiments. For example, any magnitudes or durations implied by the illustrations in FIGS. 2-6 are not intended to limit the scope of the claims or the implementation of any of the embodiments. The magnitudes and durations of the process conditions that may be used are disclosed herein in the disclosure. Further, the sequences may also include omitted portions (e.g., purging, stabilization) that have been omitted from the illustration for the purpose of ease of explanation, and not for limitation. FIGS. 2-6 are arranged to show the process conditions on the y-axis and time on the x-axis and may illustrate at least one potential embodiment of how the plasma processing system 100 may control those conditions relative to each other during substrate 110 treatments.

Figure 2:
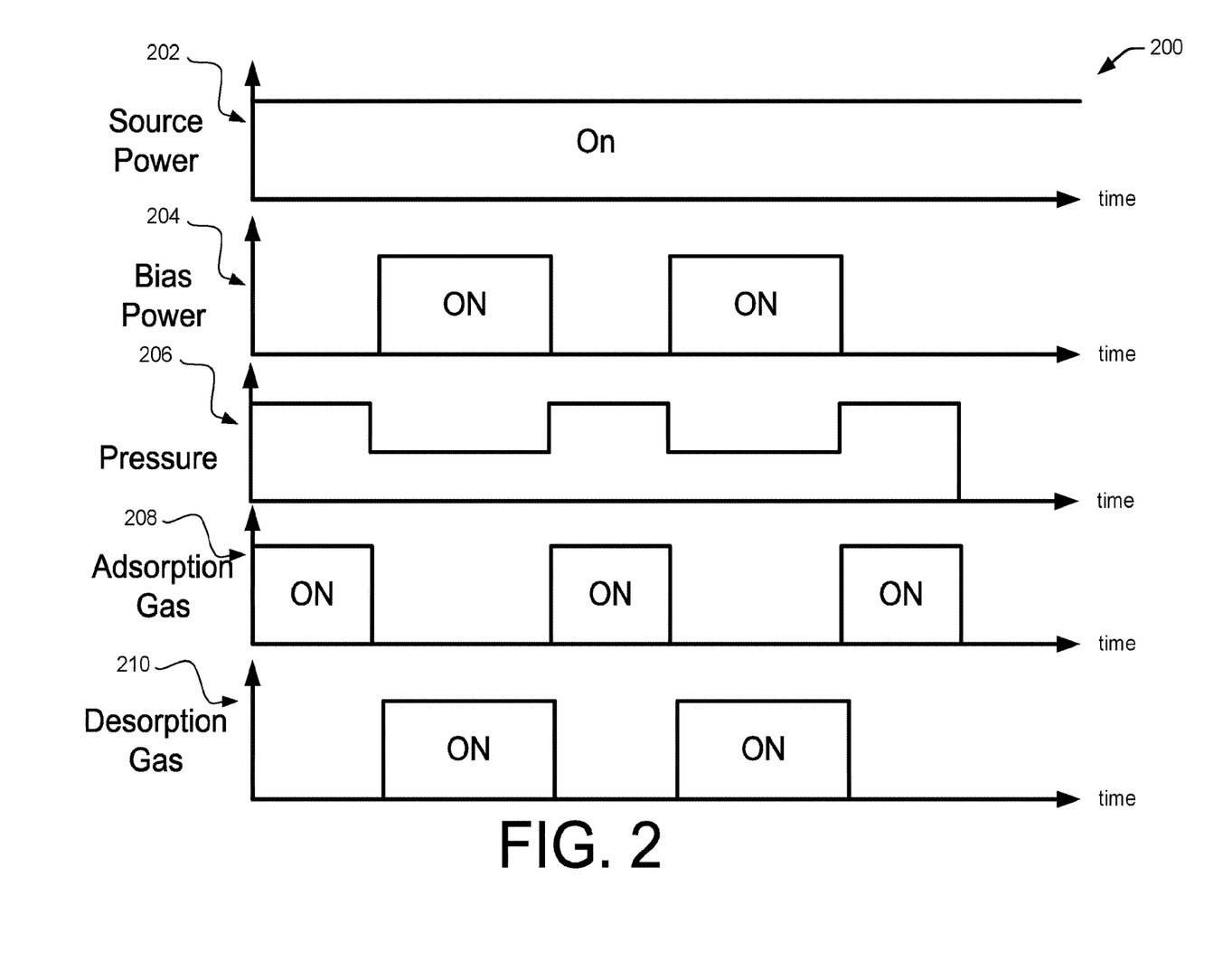
FIG. 2 illustrate multiple embodiments for transitioning between passivation/activation plasma and desorption plasma that may be used to remove monolayers from portions of the substrate.

FIG. 2 figure illustrates a sequence flow diagram 200 of an passivation/activation/desorption treatment that may be implemented by the plasma process system 100 and is intended to show one embodiment of the transition between passivation/activation and desorption plasmas (e.g., first plasma 302, second plasma 304). FIG. 2 illustrates two iterations of the passivation/activation/desorption transition, in that the passivation/activation and desorption processes are turned "on" and "off" two times. However, in other embodiments, many more iterations may be performed.

In this embodiment, the plasma processing system 100 may control the source power 202, bias power 204, passivation/activation gas 206, and desorption gas 208 to implement an iterative high precision etching process that removes monolayers from the substrate 110. In this instance, the source power 202 may be applied to the power assembly 114, the bias power 204 may be applied to the substrate holder 124, and the passivation/activation gas and the desorption gas may be distributed from the gas pathway 120. The chamber pressure may be controlled by the vacuum system 108.

The plasma processing system 100 may alternate between the passivation/activation and desorption plasma by varying the gas mixture, bias power, and chamber pressure. As shown in FIG. 2, the system 100 may alternate between a passivation/activation gas 208 mixture and a desorption gas 210 mixture in the plasma chamber 102. In conjunction with the gas mixture changes, the system may also vary the chamber pressure 206 higher or lower depending on which gas mixture may be present. In this embodiment, the chamber pressure 206 may be higher when the passivation/activation gas 208 may be present than when the desorption gas 210 may be present. Likewise, the bias power 204 be applied to the gas mixture when the desorption gas 210 is present and may be turned off when the passivation/activation gas 208 is present. In this embodiment, the source power 202 may be continuously applied to the either of the gas mixtures, however continuous source power 202 may not always be required. Although the source power 202 is shown to be constant, it may vary in magnitude in conjunction with the bias power 204, the chamber pressure 206, the passivation/activation gas 208, or the desorption gas 210. In one specific embodiment, the chamber pressure 206 during passivation/activation may be at least 40 mTorr and the chamber pressure 206 during desorption may be less than 40 mTorr.

Figure 5:
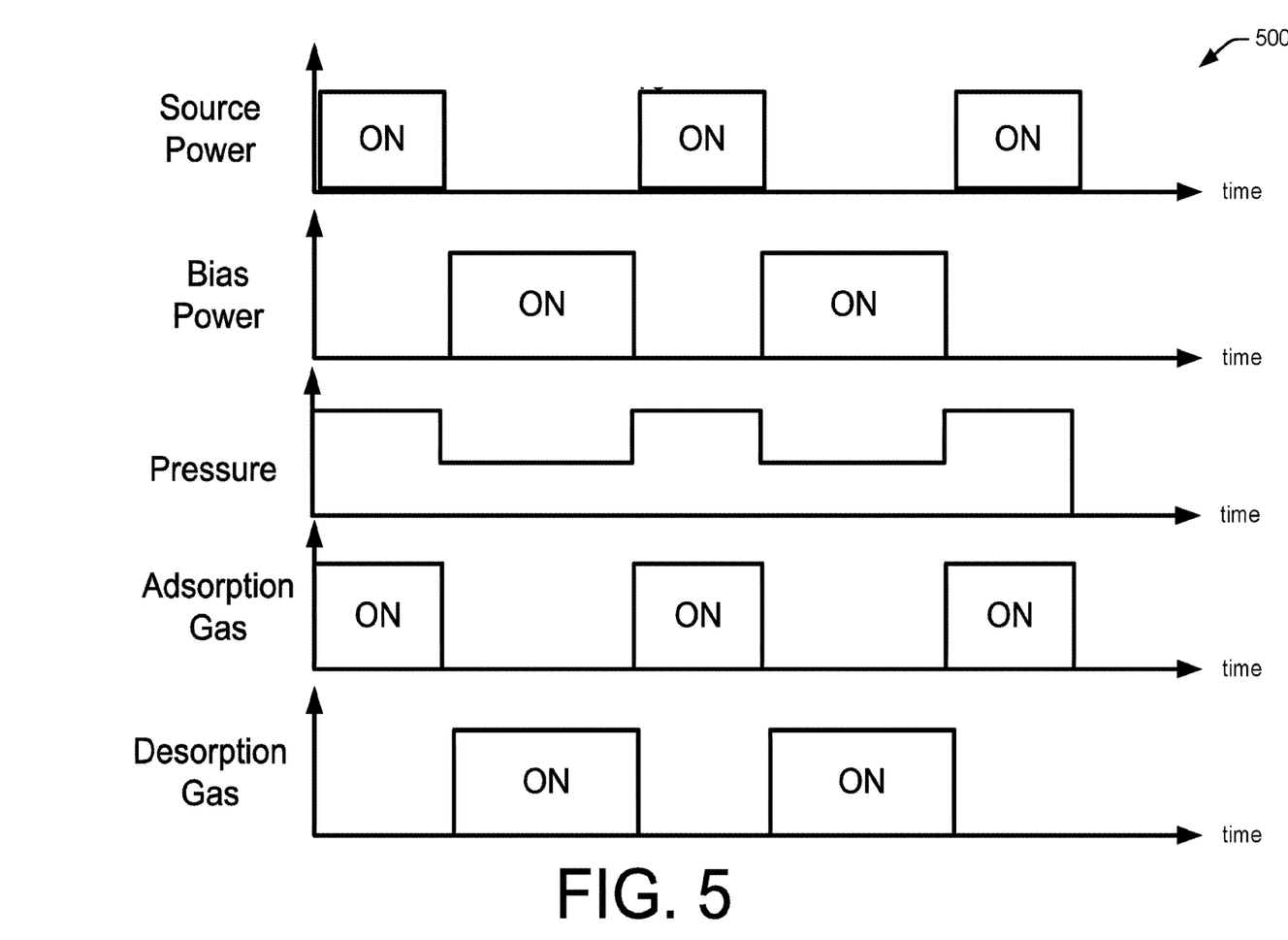
FIG. 5 illustrate multiple embodiments for transitioning between passivation/activation plasma and desorption plasma that may be used to remove monolayers from portions of the substrate.

In another embodiment, similar to the FIG. 2 embodiment, the source power 202 is not required to be constant and may turn on and off to between the passivation/activation plasma step and the desorption plasma step, as shown in FIG. 5.

Figure 3:
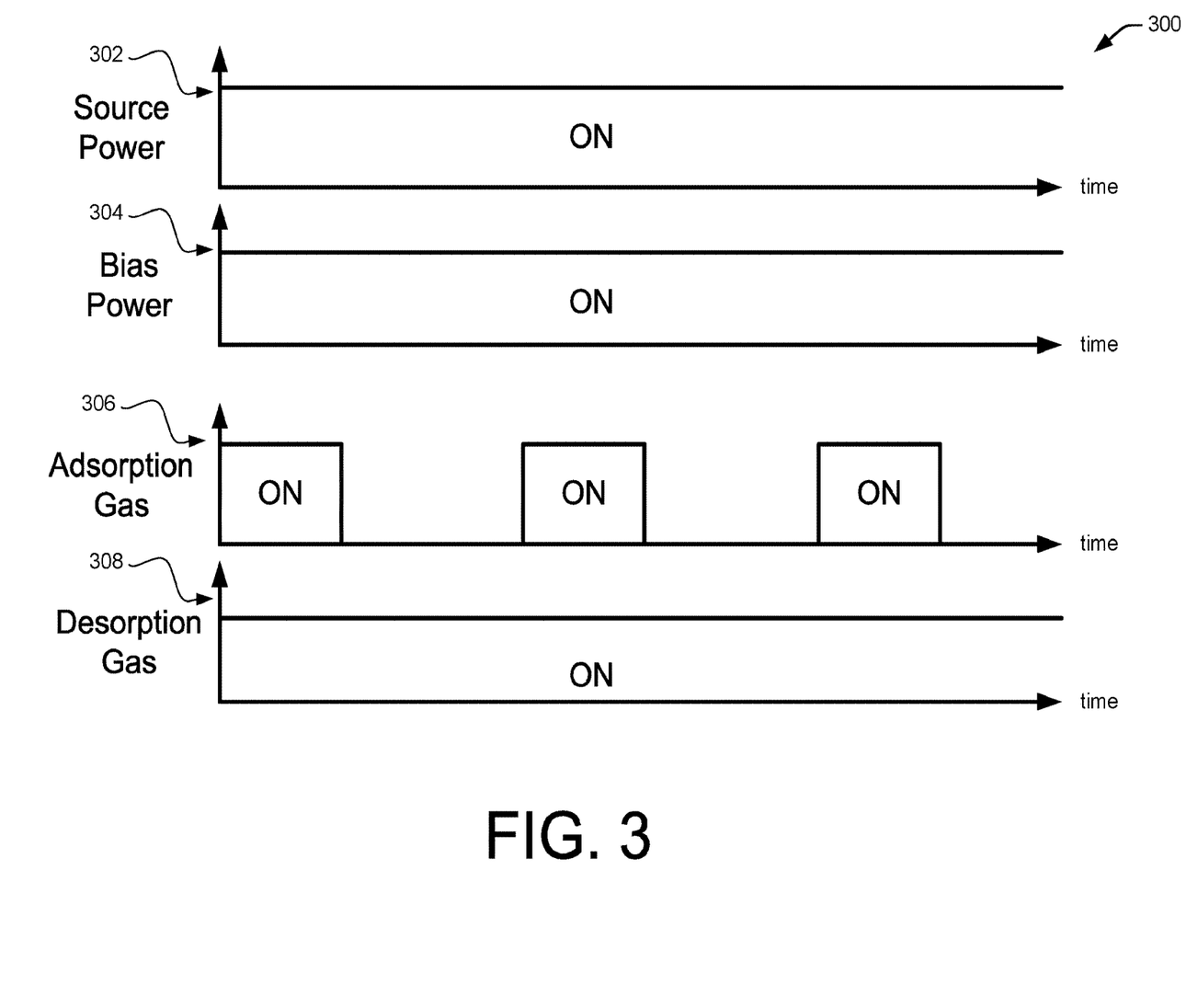
FIG. 3 illustrate multiple embodiments for transitioning between passivation/activation plasma and desorption plasma that may be used to remove monolayers from portions of the substrate.

FIG. 3 illustrates another sequence flow diagram 300 of a passivation/activation/desorption treatment that may be implemented by the plasma process system 100 and is intended to show the transition between the passivation/activation and desorption plasmas (e.g., first plasma 302, second plasma 304). In this embodiment, the illustrated sequence flow diagram 300 shows plasma treatment process that manages the transition between passivation/activation and desorption by varying the passivation/activation gas flow 306 while maintaining the source power 302, the bias power 304, and the desorption gas 308. In this instance, the amount of change in the passivation/activation gas flow 306 is greater than the relative amount of changes that may be implemented to the source power 302, the bias power 304, and the desorption gas 308. Although the FIG. 3 embodiment indicates that the other process conditions are maintained at a constant magnitude, however, these process conditions may vary during the transition, just not to the degree of change achieved by the passivation/activation gas 306. For example, the passivation/activation gas 306 may change by 20% or more by volume while the remaining process conditions may be constant or change by less than 20%. These changes may enable the passivation/activation/desorption transition to enable high precision etching of the substrate 110. In one specific embodiment, the passivation/activation gas 306 may change by 20% or more by volume, but the remaining process conditions may change by less than 10% during the passivation/activation/desorption transition.

In other embodiments, the relationship between the passivation/activation gas 306 and desorption gas 308 may be inverted, such that the transition between passivation/activation and desorption may be primarily implemented by varying the desorption gas 308. Accordingly, the passivation/activation gas 306 may be relatively constant compared to the desorption gas 308 which may vary to a much higher degree than the other process conditions. For example, the desorption gas 308 may change by 20% or more by volume while the remaining process conditions may be constant or change by less than 20%. In one specific embodiment, the desorption gas 308 may change by 20% or more by volume, but the remaining process conditions may change by less than 10% during the passivation/activation/desorption transition.

In other embodiments, the chamber pressure (not shown) may also vary in conjunction with the gas mixture changes, in that the chamber pressure may be higher during the passivation/activation process and lower during the desorption process as disclosed in embodiments herein. For example, while the source power 302, bias power 304, desorption gas 308 may remain relatively constant compared to the passivation/activation gas 306, the chamber pressure (not shown) may also vary to higher degree than the power and desorption gas 308 process conditions.

Figure 4:
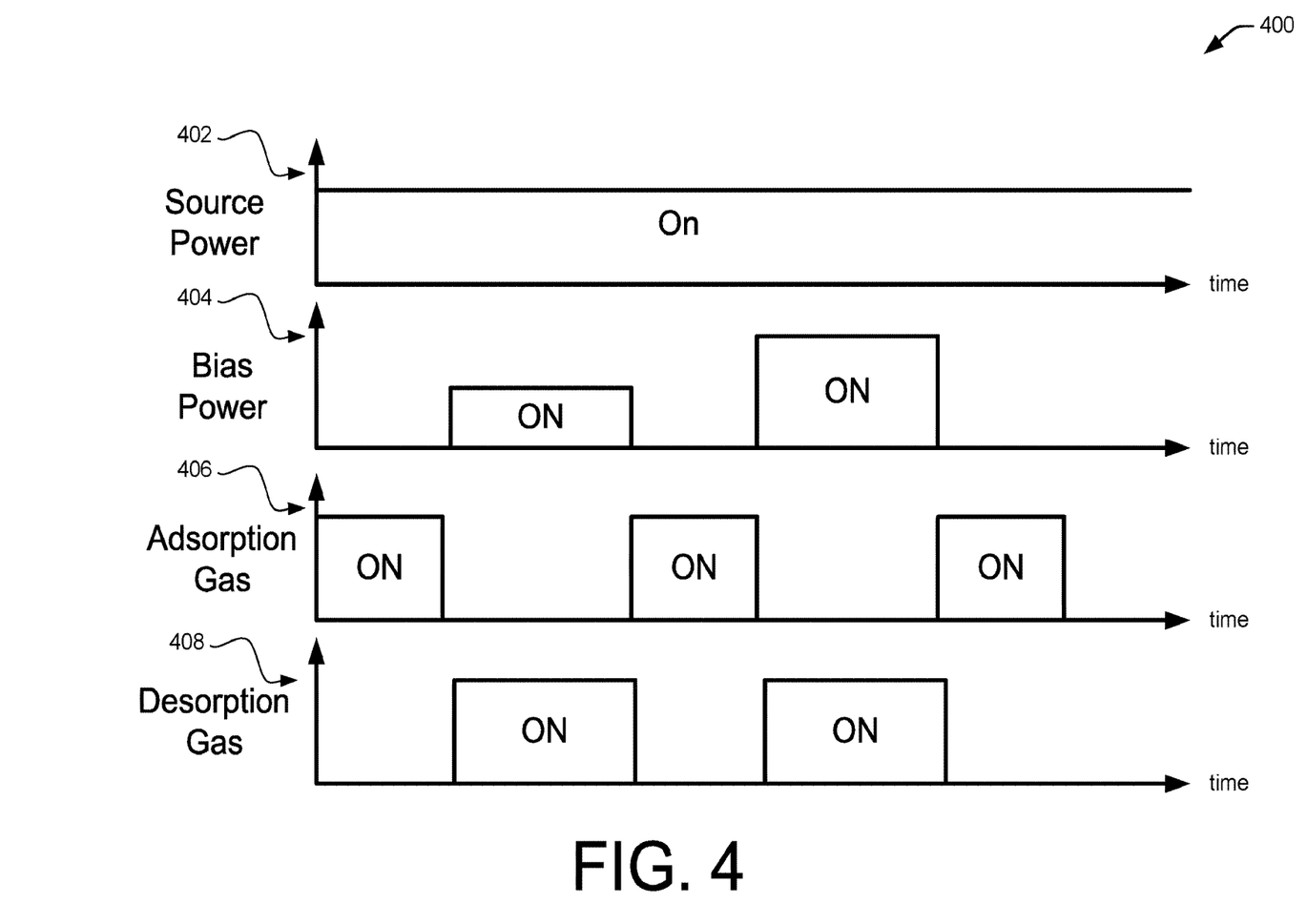
FIG. 4 illustrate multiple embodiments for transitioning between passivation/activation plasma and desorption plasma that may be used to remove monolayers from portions of the substrate.

FIG. 4 illustrates one embodiment of the plasma treatment process in which at least one of the process conditions may vary from iteration to iteration of the passivation/activation/desorption process. One or more of the process conditions (e.g., power, gas mixture, pressure, time) may increase or decrease during several iterations of the passivation/activation/desorption transition. The changes may be made to account for substrate 110 surface changes (e.g., surface area, composition, etc.) or plasma chamber 102 conditions that may vary over time. Some of these changes may be accounted for by adjusting the process conditions, via magnitude or time, during one or more subsequent iterations. Process condition changes may be made for each iteration or they may be made after two or more iterations.

FIG. 4 illustrates one specific embodiment in which one of the process conditions (e.g., bias power 404) increases in magnitude during one iteration of the passivation/activation/desorption transition. In this embodiment, the bias power 404 may be increased during the second desorption portion of the treatment. As shown in FIG. 4, the initial bias power 404 magnitude is lower than second iteration of bias power 404 which may be higher to account for the aforementioned substrate 110 changes. For example, the process condition changes may account for a trench in the substrate 110 that gets deeper with additional passivation/activation/desorption iterations. The increased bias power 404 may increase the amount of energy needed to remove the adsorbed layer 306 from a deeper trench or to minimize the number of ions 316 that may impact the sidewall of the exposed trench, as shown in FIG. 6.

In the FIG. 4 embodiment, the bias power 404 may be increased to account for that surface area change. In this embodiment, the system 100 maintains the source power 402, passivation/activation gas 406, and desorption gas 1006 at relatively constant magnitude during the passivation/activation/desorption transitions. But, the relatively constant process conditions may also vary slightly in other embodiments, such that the degree of change for the relatively constant conditions in FIG. 4 may be much less than the change in bias power 404. In one example, the degree of change in the bias power 404 may be greater than 10%, while changes in the other process conditions may be less than 10%.

However, in other embodiments, the bias power 404 may also increase or decrease with the magnitude or the time may change independently of the magnitude. In one embodiment, the desorption time may increase over time to remove a larger amount of the substrate 110 or provide an over etch to remove any residual layer on the substrate 110 or to prepare the substrate 110 for a subsequent process. However, in other embodiments, one or more process conditions may be altered in combination to account for surface area changes or composition changes. Hence, the scope of the FIG. 4 embodiments is not limited to bias power changes and may include source power, gas mixture, pressure, or any combination thereof.

Figure 6:
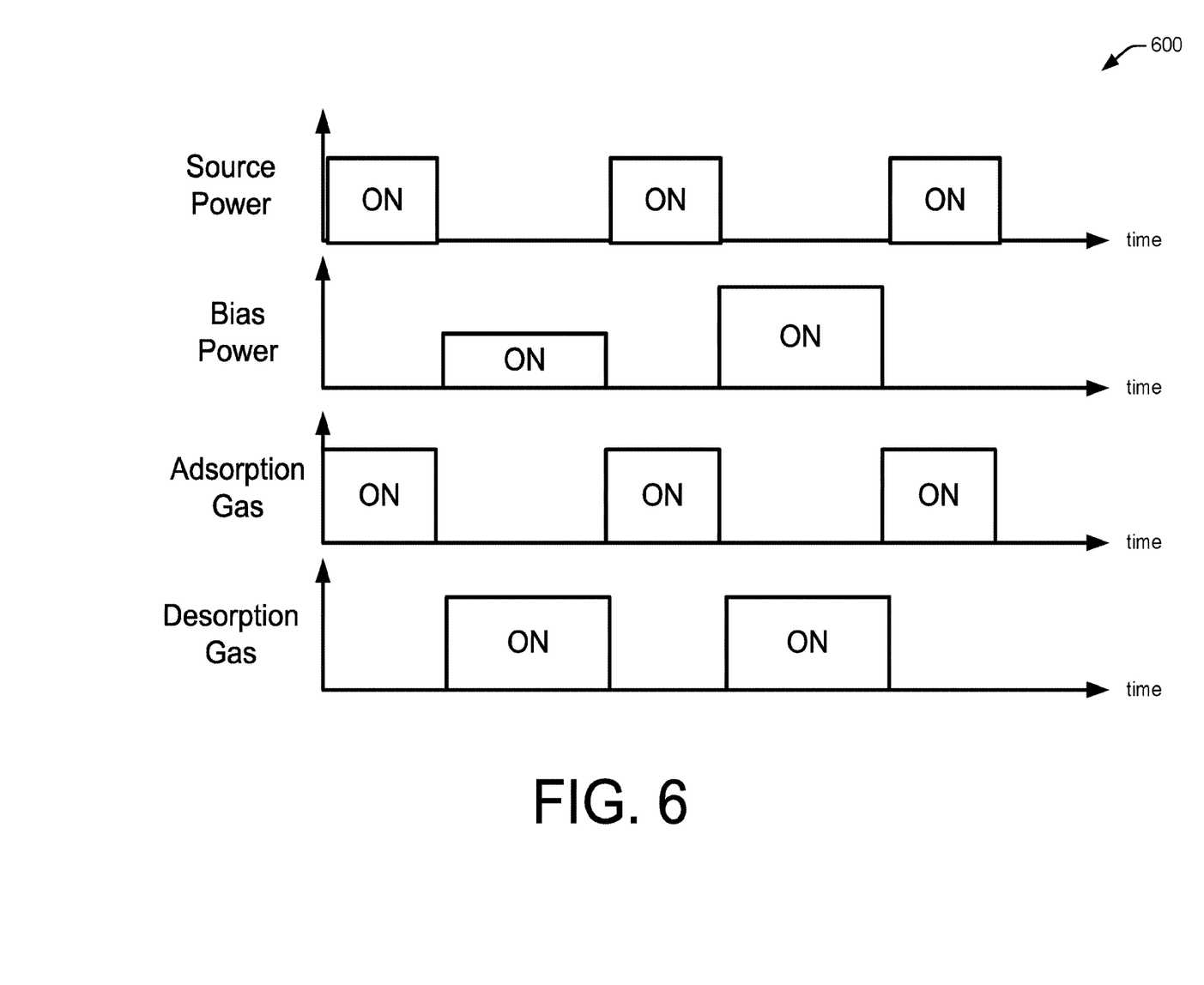
FIG. 6 illustrate multiple embodiments for transitioning between passivation/activation plasma and desorption plasma that may be used to remove monolayers from portions of the substrate.

In another embodiment, similar to the FIG. 4 embodiment, the source power 402 is not required to be constant and may turn on and off to between the passivation/activation plasma step and the desorption plasma step, as shown in FIG. 6.

Figure 7:
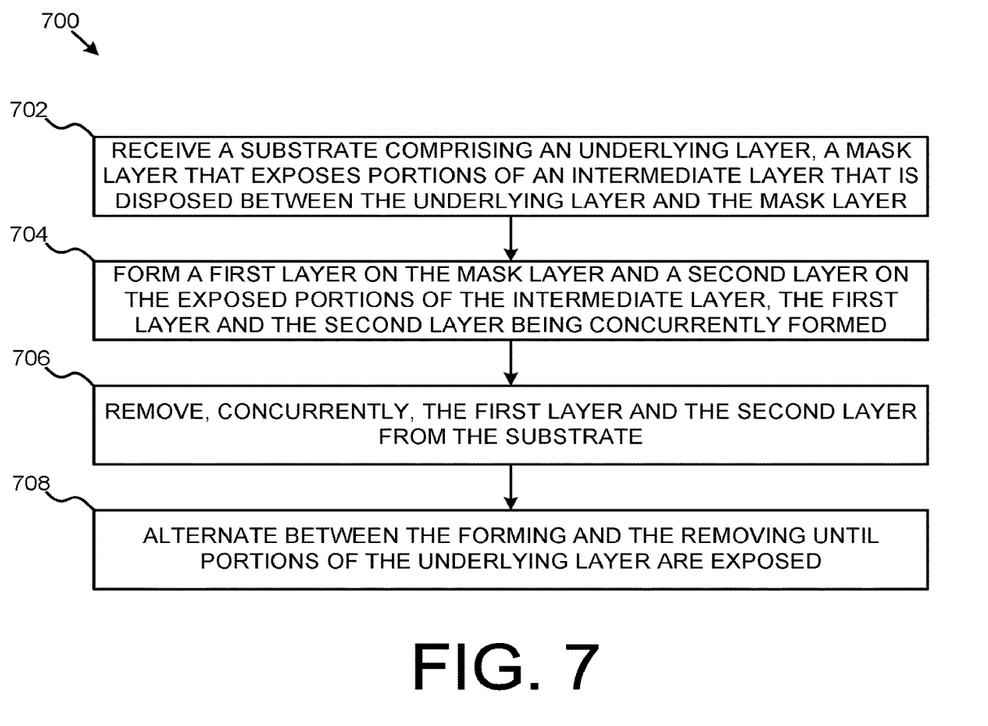
FIG. 7 is a schematic flowchart diagram illustrating one embodiment of a method for cyclic etching of a patterned layer.

FIG. 7 illustrates one embodiment of a method 700 for cyclic etching of a patterned layer are described. In an embodiment, a method 700 includes receiving a substrate comprising an underlying layer, a mask layer that exposes portions of an intermediate layer that is disposed between the underlying layer and the mask layer as shown in block 702. An embodiment may also include forming a first layer on the mask layer and a second layer on the exposed portions of the intermediate layer, the first layer and the second layer being concurrently formed as shown at block 704. Additionally, the method 700 may include removing, concurrently, the first layer and the second layer from the substrate as shown at block 706. In such embodiments, the method may include alternating between the forming and the removing until portions of the underlying layer are exposed as shown at block 708.

Figure 8:
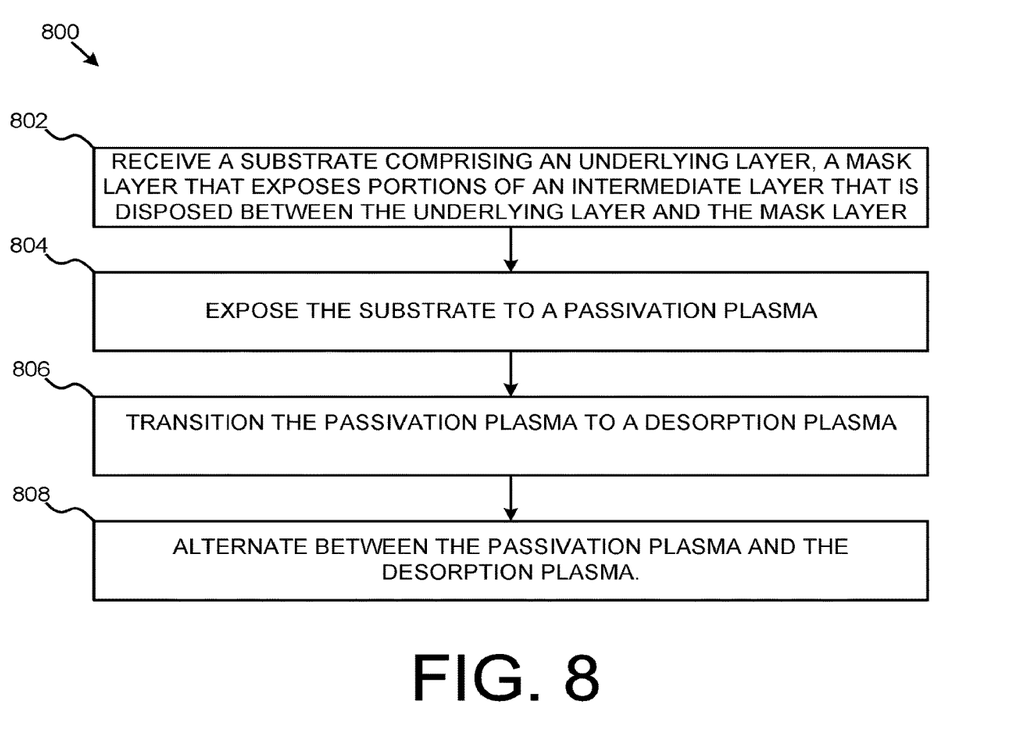
FIG. 8 is a schematic flowchart diagram illustrating one embodiment of a method for cyclic etching of a patterned layer.

FIG. 8 illustrates another embodiment of a method 800, which may include receiving a substrate comprising an underlying layer, a mask layer that exposes portions of an intermediate layer that is disposed between the underlying layer and the mask layer as shown at block 802. Additionally, the method 800 may include exposing the substrate to a passivation plasma as shown at block 804. Further, the method 800 may include transitioning the passivation plasma to a desorption plasma as shown at block 806. Additionally, the method 800 may include alternating between the passivation plasma and the desorption plasma as shown at block 808.

Figure 9:
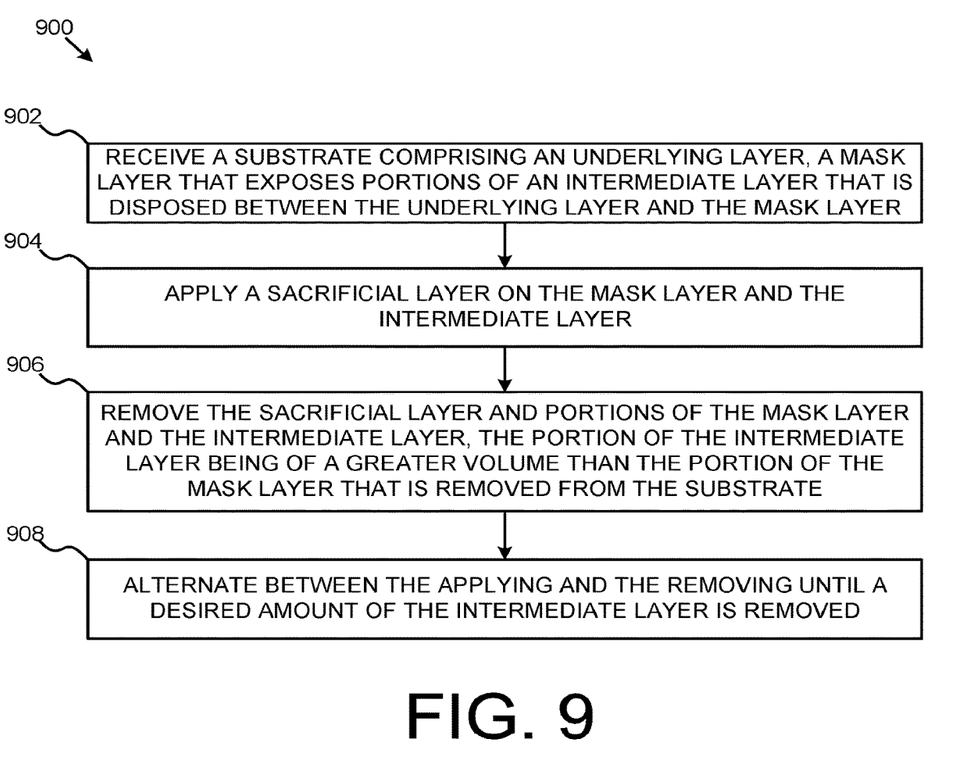
FIG. 9 is a schematic flowchart diagram illustrating one embodiment of a method for cyclic etching of a patterned layer.

FIG. 9 illustrates another embodiment, a method 900, which may include receiving a substrate comprising an underlying layer, a mask layer that exposes portions of an intermediate layer that is disposed between the underlying layer and the mask layer as shown at block 902. Such a method 900 may also include applying a sacrificial layer on the mask layer and the intermediate layer as shown at block 904. The method 900 may additionally include removing the sacrificial layer and portions of the mask layer and the intermediate layer, the portion of the intermediate layer being of a greater volume than the portion of the mask layer that is removed from the substrate as shown at block 906. Additionally, the method 900 may include alternating between the applying and the removing until a desired amount of the intermediate layer is removed as shown at block 908.

Figure 10A:
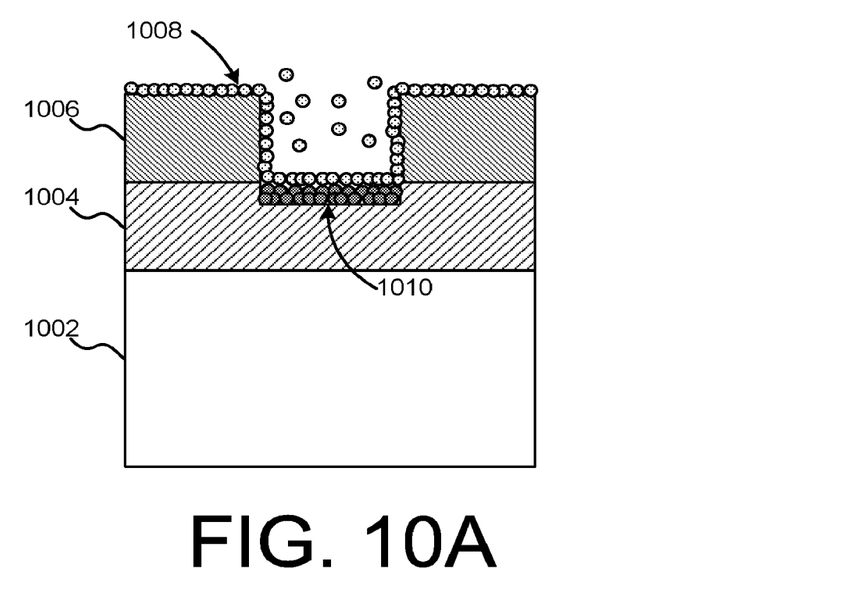
FIGS. 10A-10B include schematic representations of one embodiment of a method for cyclic etching of a patterned layer.
Figure 10B:
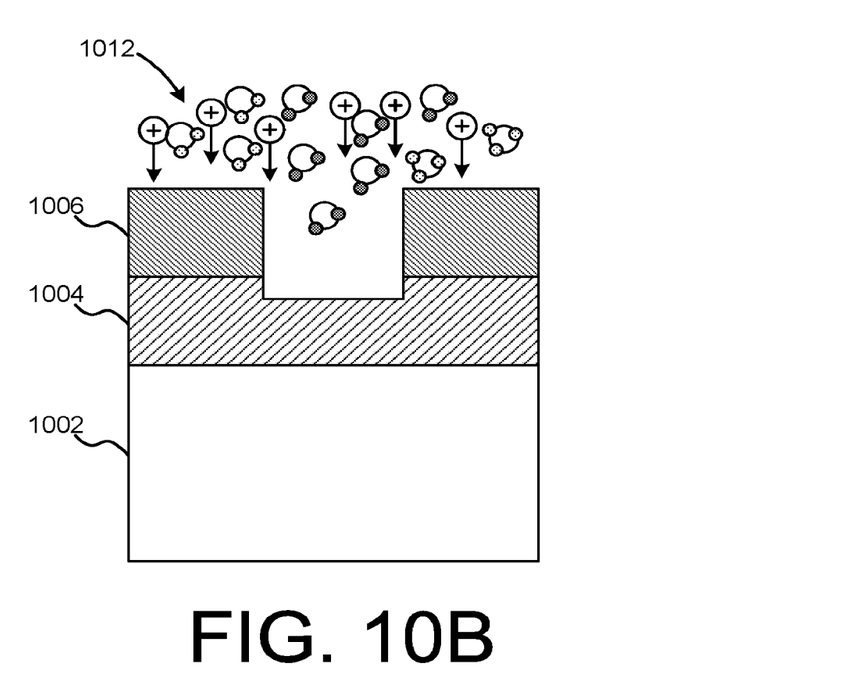

FIGS. 10A-B illustrate one embodiment of a process for cyclic etching of a patterned layer according to the embodiments described above. In one embodiment, the process includes receiving a substrate comprising an underlying layer 1002, a mask layer 1006 that exposes portions of an intermediate layer 1004 that is disposed between the underlying layer 1002 and the mask layer 1006. An embodiment may also include forming a first layer 1008 on the mask layer 1006 and a second layer 1010 on the exposed portions of the intermediate layer 1004, the first layer 1008 and the second layer 1010 being concurrently formed. Additionally, the process may include removing, concurrently, the first layer and the second layer from the substrate as shown in FIG. 10B. In such embodiments, the process may include alternating between the forming shown in FIG. 10A and the removing shown in FIG. 10B until portions of the underlying layer 1002 are exposed. In a particular embodiment, the first layer 1008 may be formed by a passivation process and the second layer 1010 may be formed by an activation process. In an embodiment, the removing may be performed with a desorption process. Embodiments of such processes are described above with relation to FIGS. 2-6.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present disclosure has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. A method for treating a substrate, comprising:
   receiving a substrate comprising an underlying layer, a mask layer that exposes portions of an intermediate layer that is disposed between the underlying layer and the mask layer;
   forming a first layer on the mask layer and a second layer on the exposed portions of the intermediate layer, the first layer and the second layer being concurrently formed;
   removing, concurrently, the first layer and the second layer from the substrate; and
   alternating between the forming and the removing until portions of the underlying layer are exposed,
   wherein the first layer and the second layer have different compositions, and
   wherein the forming comprises exposing the substrate to fluorocarbon (CxFy) gas.

2. The method of claim 1, wherein the mask layer comprises a light-sensitive film and the intermediate layer comprises any combination of the following: silicon, oxygen, hydrogen, carbon, nitrogen, or any combination thereof.

3. The method of claim 2, wherein the mask layer comprises any organic material.

4. The method of claim 1, wherein the forming comprises exposing the substrate to a fluorocarbon (CxFy) and hydrocarbon gas (CxHy) mix.

5. The method of claim 1, wherein the removing comprises exposing the substrate to an inert gas plasma.

6. The method of claim 1, wherein the alternating comprises transitioning between fluorocarbon plasma and an inert gas plasma.

7. A method for treating a substrate, comprising:
- receiving a substrate comprising an underlying layer, a mask layer that exposes portions of an intermediate layer that is disposed between the tuiderlying layer and the mask layer;
- forming a first layer on the mask layer and a second layer on the exposed portions of the intermediate layer, the first layer and the second layer being concurrently formed;
- removing, concurrently, the first layer and the second layer from the substrate; and
- alternating between the forming and the removing until portions of the underlying layer are exposed,
- wherein the first layer comprises a fluorocarbon polymer, and the second layer comprises activated inorganic fluorocarbon polymer complex.

\* \* \* \* \*

UNITED STATES PATENT AND TRADEMARK OFFICE
CERTIFICATE OF CORRECTION

PATENT NO. : 10,971,373 B2
APPLICATION NO. : 16/446070
DATED : April 6, 2021
INVENTOR(S) : Ranjan et al.

It is certified that error appears in the above-identified patent and that said Letters Patent is hereby corrected as shown below:

In the Claims

In Column 13, Claim 7, Line 9, delete "tuiderlying" and insert -- underlying --, therefor.

Signed and Sealed this
Nineteenth Day of April, 2022

Katherine Kelly Vidal
*Director of the United States Patent and Trademark Office*